(12) United States Patent
Tang

(10) Patent No.: US 6,642,799 B2
(45) Date of Patent: Nov. 4, 2003

(54) PHASE LOCK LOOP DESTRESS CIRCUIT

(75) Inventor: Benjamim Tang, Hawthorne, CA (US)

(73) Assignee: Primarian, Inc., Tempe, AZ (US)

( * ) Notice: Subject to any disclaimer, the term of this patent is extended or adjusted under 35 U.S.C. 154(b) by 0 days.

(21) Appl. No.: 09/986,542

(22) Filed: Nov. 1, 2001

(65) Prior Publication Data

US 2002/0075081 A1 Jun. 20, 2002

Related U.S. Application Data

(60) Provisional application No. 60/244,944, filed on Nov. 1, 2000, and provisional application No. 60/244,945, filed on Nov. 1, 2000.

(51) Int. Cl.$^7$ ................................................ H03L 7/00
(52) U.S. Cl. .............................. 331/16; 331/17; 331/25
(58) Field of Search ............................... 331/16, 10, 17, 331/25, 176

(56) References Cited

U.S. PATENT DOCUMENTS

| | | | | | |
|---|---|---|---|---|---|
| 5,600,321 | A | * | 2/1997 | Wincn | 341/144 |
| 5,604,465 | A | * | 2/1997 | Farabaugh | 331/10 |
| 5,847,616 | A | * | 12/1998 | Ng et al. | 331/57 |
| 5,977,898 | A | * | 11/1999 | Ling et al. | 341/144 |
| 6,188,739 | B1 | * | 2/2001 | Everitt et al. | 375/376 |
| 6,300,831 | B1 | * | 10/2001 | Xi | 330/252 |

* cited by examiner

*Primary Examiner*—Robert Pascal
*Assistant Examiner*—Kimberly E Glenn
(74) *Attorney, Agent, or Firm*—Theodore E. Galanthay

(57) ABSTRACT

An improved phase lock loop destress circuit is described. The PLL circuit includes a loop destress logic circuit and a coarse tune digital-to-analog converter, which are coupled to a summer and driver, which in turn is coupled to a voltage controlled oscillator. The loop destress logic circuit is configured to automatically select a digital word for use in coarse tuning the voltage controlled oscillator.

24 Claims, 8 Drawing Sheets

PHASE LOCK LOOP DESTRESS CIRCUIT

CROSS REFERENCE TO RELATED APPLICATIONS

This Application claims priority to Provisional Application Ser. No. 60/244,944, entitled Phase Lock Loop Destress Circuit and Method of Forming Same, filed Nov. 1, 2000, and to Provisional Application Serial No. 60/244,965, entitled High Speed Voltage-Controlled Ring Oscillator, filed Nov. 1, 2000.

TECHNICAL FIELD

The present invention generally relates to microelectronic devices. More particularly, the present invention relates to phase lock loop circuits including loop destress logic that automatically selects an appropriate coarse setting based on a control setting under lock.

BACKGROUND OF THE INVENTION

Phase lock loop (PLL) circuits are often employed to generate stable output frequency signals from a fixed, low frequency signal. Such circuits are often employed in receivers, transceivers, frequency multipliers, and frequency demodulators.

Traditional PLL circuits generally include a phase detector, a charge pump, a loop filter, and a voltage controlled oscillator (VCO). In operation, the phase detector receives a reference signal and a signal from the output of the PLL, compares the phase difference of the signals and produces an error current pulse signal indicative of the difference in phase, the loop filter converts the current pulse signal to a direct current voltage level, and the VCO adjusts its oscillation frequency based on the control voltage received from the filter until the error between the output signal from the PLL circuit and the reference frequency is near zero, i.e., the signals are "locked" to each other.

The control voltage from the filter is often limited by the chip power supply to a maximum range of about to about two to five volts, which corresponds to the range of output frequencies from the VCO. In other words, the frequency of VCO can be manipulated from its low frequency to its high frequency by adjusting the input control voltage to the VCO over a range of about two to five volts. In this case, very small changes in voltage lead to large changes in VCO output frequencies. Consequently, electronic noise in or proximate the PLL circuit may undesirably cause large changes in the output frequency of the PLL circuit.

To reduce a sensitivity of VCO frequency to input control voltage, conventional PLL circuits may include digital tuning architecture. For example, the PLL circuit may include coarse-tuning architecture that uses a digital word to facilitate tuning of the PLL. Such conventional tuning circuitry typically requires preselection of a digital word which limits an overall operating frequency of the VCO. Although preselection of the digital word facilitates tuning of the PLL, such preselection may not allow for optimal tuning of the PLL. Accordingly, improved PLL circuits with digital tuning architecture are desired.

SUMMARY OF THE INVENTION

The present invention provides an improved phase lock loop circuit. More particularly, the invention provides a PLL circuit that uses digital logic for coarse tuning of the PLL circuit.

The way in which the present invention addresses the drawbacks of the now-known PLL circuits is discussed in greater detail below. However, in general, the invention provides an improved PLL circuit that is capable of selecting a word for use in tuning the circuit, wherein the word is selected based on an amount of change desired in the operating frequency of the VCO.

In accordance with one embodiment of the invention, a PLL circuit includes an integrator, a summer and driver, a voltage controlled oscillator, and a loop destress logic circuit and a coarse tune digital-to-analog converter coupled between the integrator and the summer and driver.

In accordance with one aspect of the invention, the voltage controlled oscillator includes a look-ahead interpolation architecture to further facilitate tuning of the VCO.

In accordance with a further embodiment of the invention, the PLL circuit includes a differential voltage to current translator to generate control voltages for a portion of the VCO.

In accordance with a further embodiment of the invention, the coarse tune digital-to-analog converter is a current output digital-to-analog converter. In accordance with one aspect of this embodiment, the digital-to-analog converter is an eight bit converter.

In accordance with a further embodiment of the invention, the integrator includes a differential output operational amplifier. In accordance with one aspect of this embodiment, the integrator also includes two feedback loops, each including a capacitor and a resistor.

In accordance with yet another embodiment of the invention, the PLL circuit includes two comparators for providing input to the coarse tune digital-to-analog converter, wherein the input provided is indicative of a desired coarse tune adjustment.

BRIEF DESCRIPTION OF THE DRAWINGS

The present invention is illustrated by way of example and not limitation in the accompanying figures, in which like references indicate similar elements, and in which.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION OF EXEMPLARY EMBODIMENTS

The present invention generally relates to a phase lock loop (PLL) circuit. More particularly, the invention relates to a phase lock loop circuit that includes architecture to dynamically update a digital word used to coarse tune a PLL circuit.

The present invention may be described herein in terms of various functional components and various processing steps. It should be appreciated that such functional components may be realized by any number of hardware or structural components configured to perform the specified functions. For example, the present invention may employ various integrated components comprised of various electrical devices, e.g., resistors, transistors, capacitors, diodes and the like, whose values may be suitably configured for various intended purposes. In addition, the present invention may be practiced in any integrated circuit applications employing PLL circuits. Such general applications that may be appreciated by those skilled in the art in light of the present disclosure are not described in detail. Further, it should be noted that while various components may be suitably coupled or connected to other components within exemplary circuits, such connections and couplings can be realized by direct connection between components, or by connection through other components and devices located therebetween.

Figure 1:
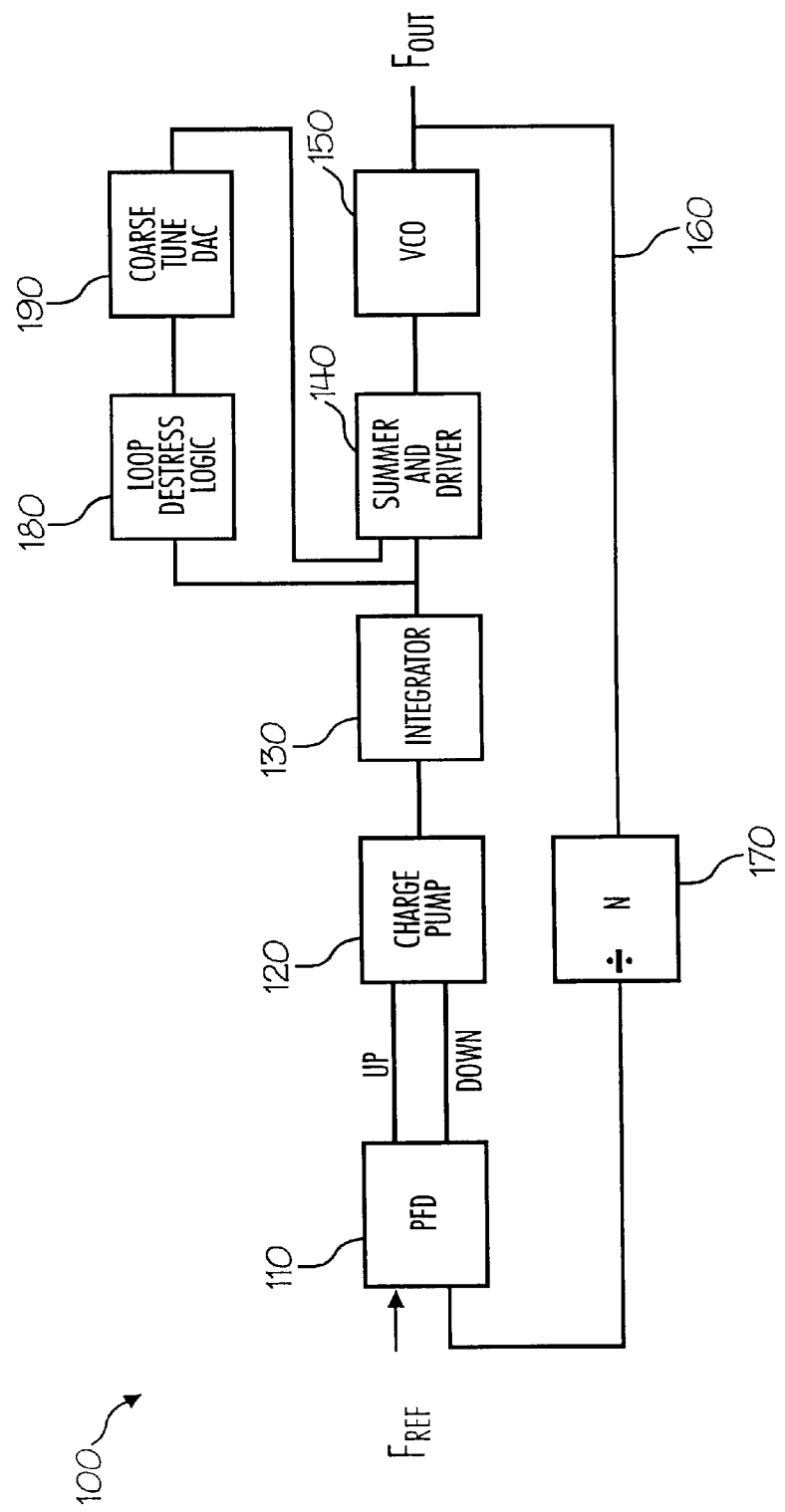
FIG. 1 is a schematic illustration of a phase lock loop circuit in accordance with the present invention.

FIG. 1 schematically illustrates a PLL circuit 100 in accordance with the present invention. PLL circuit 100 includes a phase frequency detector 110, a charge pump 120, an integrator 130, a summer and driver 140, a voltage controlled oscillator (VCO) 150, a feedback loop 160, a frequency divider 170, a loop destress logic circuit 180, and a coarse tune digital-to-analog converter (DAC) 190.

PLL circuit 100 is configured such that loop destress logic circuit 180 and coarse tune DAC 190 facilitate tuning of VCO 150. More particularly, PLL 100 is designed such that coarse tuning of the PLL circuit is performed by coarse tune DAC 190 and loop destress logic circuit 180, while fine tuning of PLL 100 is governed by integrator 130. In addition, as explained in greater detail below, circuit 100 is configured to digitally update a word used to coarse tune circuit 100 based on operating conditions of PLL circuit 100.

In operation, an entire voltage output range (e.g., from about −1.2 V to about 1.2 V) from integrator 130 varies the frequency of VCO 150 only over a portion of VCO 150 operating frequency. For example, the entire range of voltage output from integrator 130 may vary the frequency of VCO 150 by one-fourth of its operating frequency range; the fraction of the operating frequency is determined by frequency divider 170 and may be selected as desired for a particular application. Because the entire voltage range of integrator 130 varies the operating frequency only over a portion of the operating frequency of the circuit, PLL circuit 100 is less susceptible to large fluctuation in frequency resulting from electronic noise.

Figure 2:
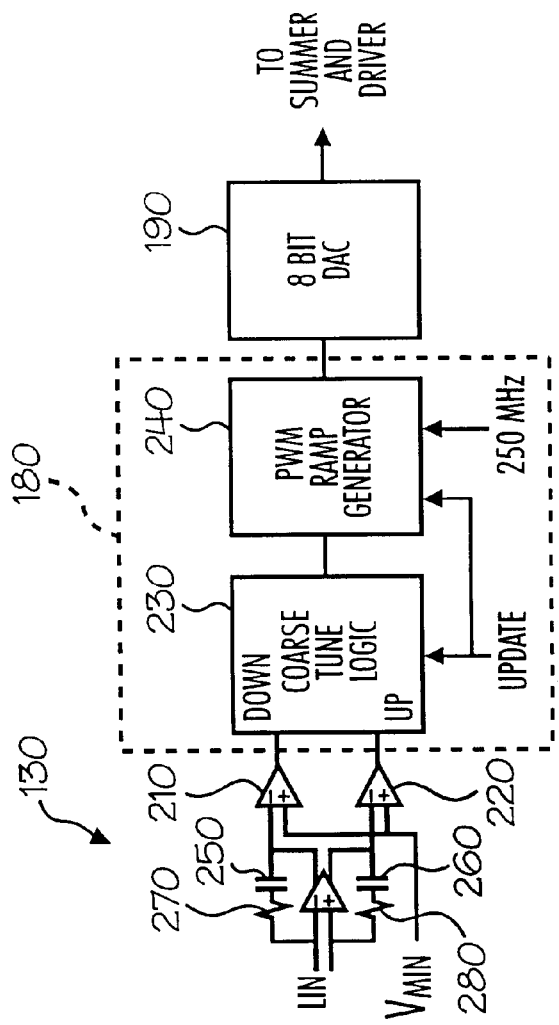
FIG. 2 is a schematic illustration of a loop destress logic circuit with pulse width modulation architecture in accordance with the present invention.

FIG. 2 illustrates, in more detail, loop destress logic 180 and coarse tune DAC 190 in accordance with one embodiment of the invention. Destress logic circuit 180 includes comparators 210 and 220 to determine whether a voltage output from integrator 130 is close to its lower or upper limits, a coarse tune logic circuit 230, and a ramp generator 240. Information from comparators 210 and 220 is used to update a digital word at coarse tune logic circuit 230 when the voltage output from integrator 130 is above or below specified limits (e.g., voltages corresponding to frequencies outside the range of about 2.3 to about 2.7 GHz).

In accordance with one embodiment of the invention, logic circuit 230 is configured such that a digital word corresponds to about half the output voltage range of integrator 130. For example, if the output from integrator 130 ranges from about −1.2 V to about 1.2 V, half of the frequency range may be covered by one digital codeword and the −1.2 V to 0 V range, or alternatively, by an adjacent codeword and the 0V to +1.2 V range. Assigning the range one word to half the integrator output voltage range prevents the output of coarse tune DAC 190 from going from its highest value to its lowest value and vice versa. Other ranges may be assigned to digital words in accordance with other embodiments of the invention.

Destress logic 180 may be configured in a variety of ways. For example, logic 180 may be configured such that the output voltage range of DAC 190 is four times greater than the output voltage range of integrator 130. Alternatively, DAC 190 output may be 8, 16, or other multiples of integrator 130 output.

In accordance with a further embodiment of the invention, loop destress logic 180 is configured to reduce an amount of error introduced to summer and driver 140 and consequently VCO 150 by slowly ramping up or down the output voltage from DAC 190. In accordance with one aspect of this embodiment, the ramp may be accomplished using high resolution digital control to effect several small voltage transitions rather than a large single-step transition. Alternatively, a pulse width modulation generator 240 and a suitable filter may be used to effect a relatively smooth voltage transition to reduce any error introduced to VCO 150 as a result of a word change.

Figure 3:
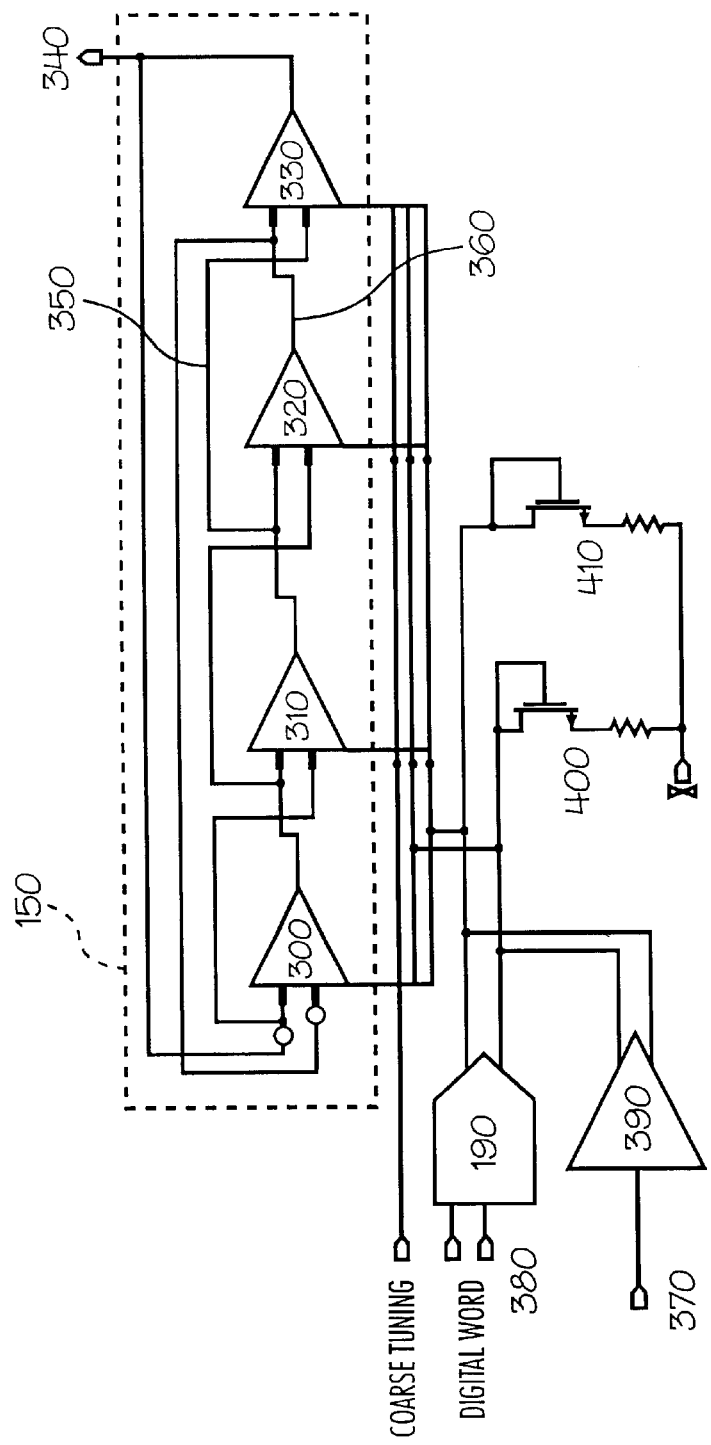
FIG. 3 is a schematic illustration of a summer and driver, a voltage controlled oscillator, and a coarse tune digital-to-analog converter in accordance with the present invention.

FIG. 3 schematically illustrates in more detail VCO 150 and DAC 190 in accordance with the present invention. As discussed in more detail below, VCO 150 includes a lookahead interpolation scheme; however, other voltage controlled oscillators may also be used in accordance with the present invention.

In the illustrated embodiment, VCO 150 includes four interpolation stages 300, 310, 320, and 330, which provide a desired output frequency at a port 340. The "look-ahead interpolation" architecture of VCO 150 allows a stage to interpolate signals input to an immediately previous delay stage, rather than just the output of the previous delay stage. For example, delay stage 330 receives a signal along a path 350 from an input side of stage 320 and from a path 360 from an output side of stage 320.

Operational frequency of VCO 150 is controlled using a differential control voltage at input 370 for fine tuning of the VCO and a coarse tune digital word at input 380 for coarse tuning of the VCO. The differential control voltage from port 370 is input to a differential current translator 390, which converts the voltage to a current. The current from translator 390 is summed with current from differential current output digital-to-analog converter 190 and input into current mirrors 400 and 410. As noted above, the range of differential voltage to translator 390 is selected such that translator 390 outputs a current to manipulate the operating frequency of VCO 150 only over a portion of the operational frequency of VCO 150, while output from DAC 190 is configured to enable manipulation of the frequency over the entire operating frequency (e.g., an operating range of about 1.5 GHz to about 3.0 GHz).

Figure 4:
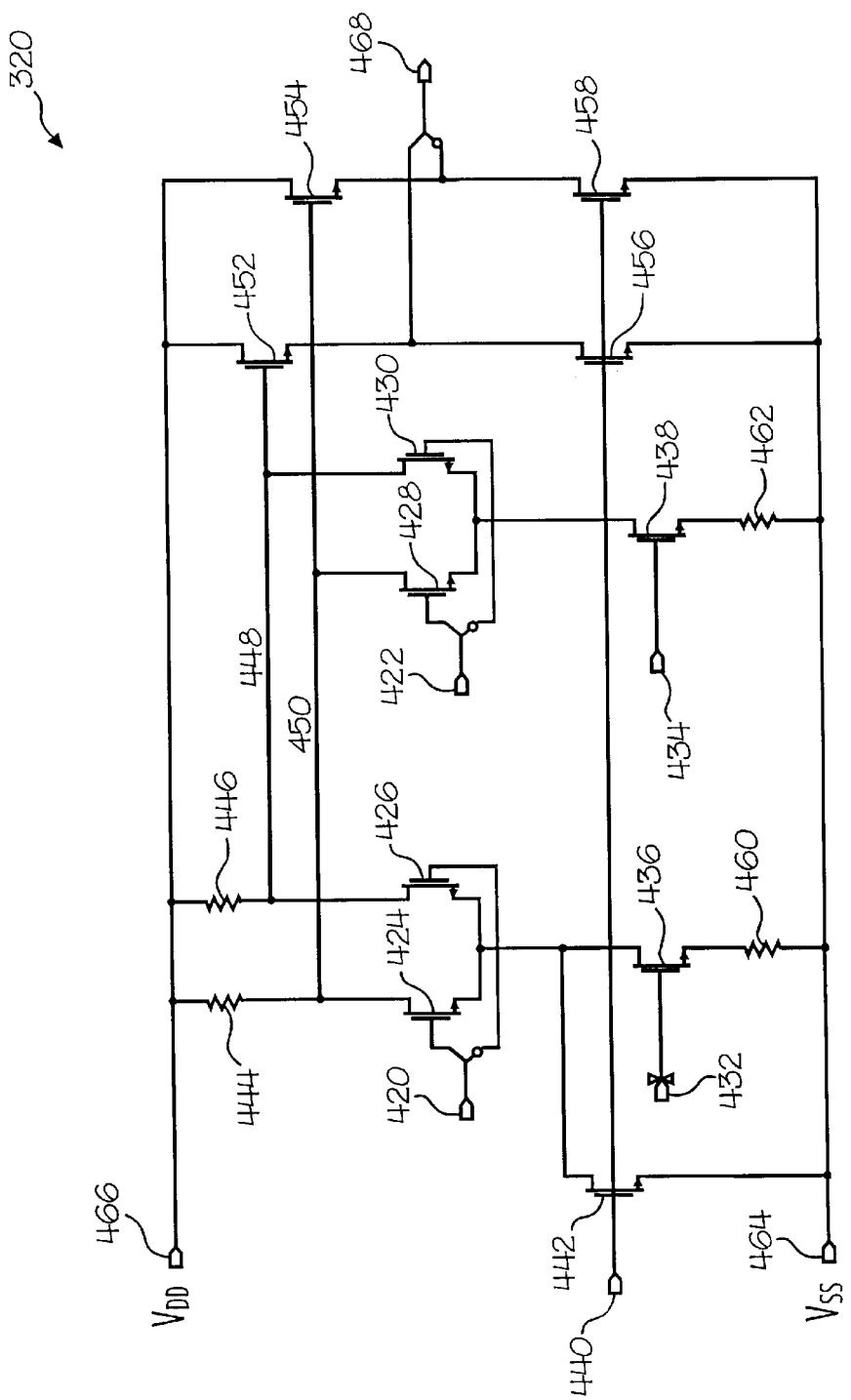
FIG. 4 is a schematic illustration of an interpolation stage of the voltage controlled oscillator illustrated in FIG. 3.

FIG. 4 illustrates an interpolation stage, e.g., stage 320 of VCO 150, in greater detail. Stage 320 includes input ports 420 and 422, a differential pair including transistors 424 and 426, a differential pair including transistors 428 and 430, control voltage ports 432 and 434, current sinks 436 and 438, a control voltage port 440, a current source transistor 442, resistor loads 444 and 446, voltage nodes 448 and 450, source follow transistors 452 and 454, current source transistors 456 and 458, resistors 460, 462, input ports 464 and 466, and differential output port 468.

Differential stage 320 is configured to interpolate a time delay between two signals. In particular, the stage is designed to interpolate time delays (with an additional delay added by the stage) between signals, having substantially the same waveform, input at ports 420 and 422.

In operation, a signal received at port 420 is passed through differential pair transistors 424 and 426 and a signal received at port 422 is passed through differential pair transistors 428 and 430 to loads 444 and 446. A control voltage is applied to ports 432 and 434 to generate current sinks through transistors 436 and 438, respectively. In accordance with one exemplary embodiment of the invention, the control voltages applied to ports 432 and 432 are generated through current mirrors, such that the sum of the current through current sinks 436 and 438 is constant. In other words, the control voltage is used to cause a substantially constant amount of current to flow through either differential pair including transistors 424 and 424 or differential pair including transistors 428 and 430. An additional fixed current is provided to differential pair transistors 424 and 426 using voltage applied at node 440 and transistor 442. Thus, even if the current though current sinks 436 and 438 are steered completely through transistors 428 and 430, a fixed amount of current is still provided to transistors 424 and 426.

The current in differential pair 424 and 426 is switched according to the input signal at node 420 and the current in differential pair 428 and 430 is switched according to the input signal at node 422. The current from the differential pair transistors 424–430 is summed by tying together the drains of transistors 424 and 428 and the drains of transistors 426 and 430. The summed currents flows through resistor loads 444 and 446, generating a differential voltage on nodes 448 and 450. Since the signals at node 420 and node 422 are slightly delayed versions of each other, the delay of the signals on nodes 448 and 450 can be varied by changing the ratio of current in differential pair transistors 424 and 426, and differential pair transistors 428 and 430. Transistors 452 and 424 buffer the signal on nodes 448 and 450, providing a differential output on port 468.

Figure 5:
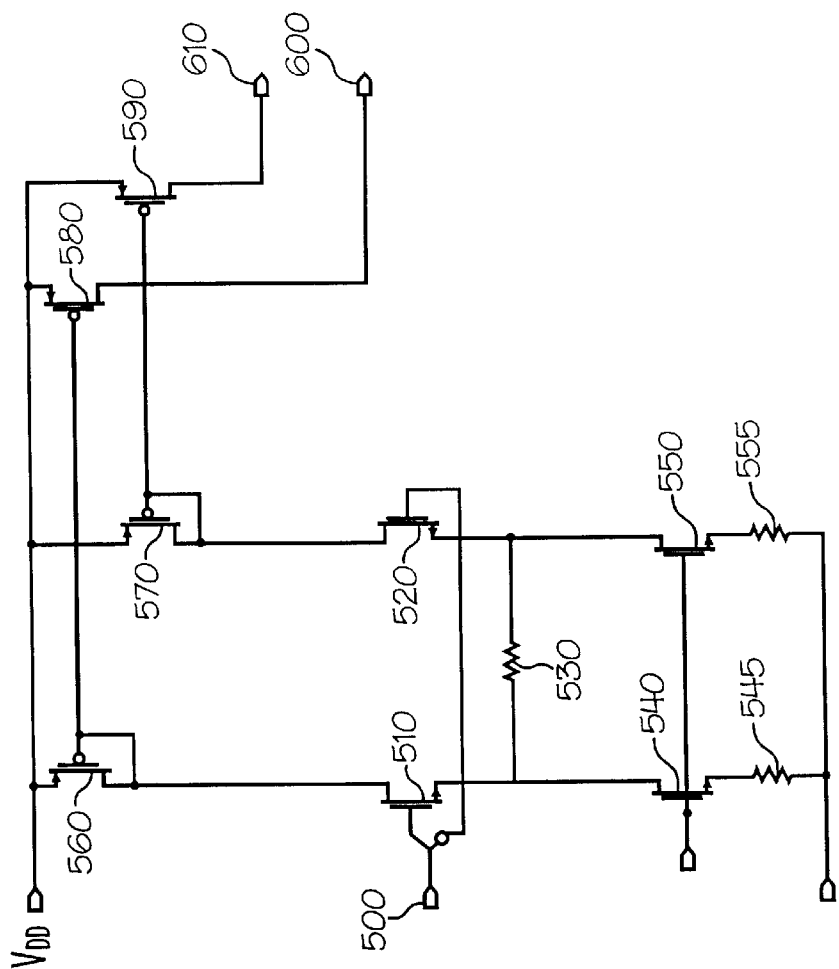
FIG. 5 is a schematic illustration of a differential voltage-to-current translator for use with the PLL circuit illustrated in FIG. 1.

FIG. 5 illustrates a differential voltage-to-current translator 501 configured to generate current, which when supplied to current mirrors, produces the control voltage for ports 432 and 434, illustrated in FIG. 4. Translator 501 includes input node 500, transistors 510, 520, and 560–590, current sinks 540 and 550, resistors 530, 545 and 555, and output ports 600 and 610.

In operation, differential voltage is supplied to circuit 501 at input 500. Transistors 510, 520 and resistor 530 form a degenerated differential transistor pair that steers the current generated by current sinks 540 and 550 based on the differential voltage applied to node 500. Exemplary circuit 501 is configured such that the sum of drain currents of transistors 510 and 520 is substantially equal to the sum of drain currents of transistors 540 and 550, and the difference in the drain currents in transistors 510 and 520 is dependent upon the differential voltage at port 500. The drain current in transistor 510 is mirrored by transistors 560 and 580, providing an output current at port 600. Similarly, the drain current in transistor 520 is mirrored by transistors 570 and 590, providing an output current at port 610.

Figure 6:
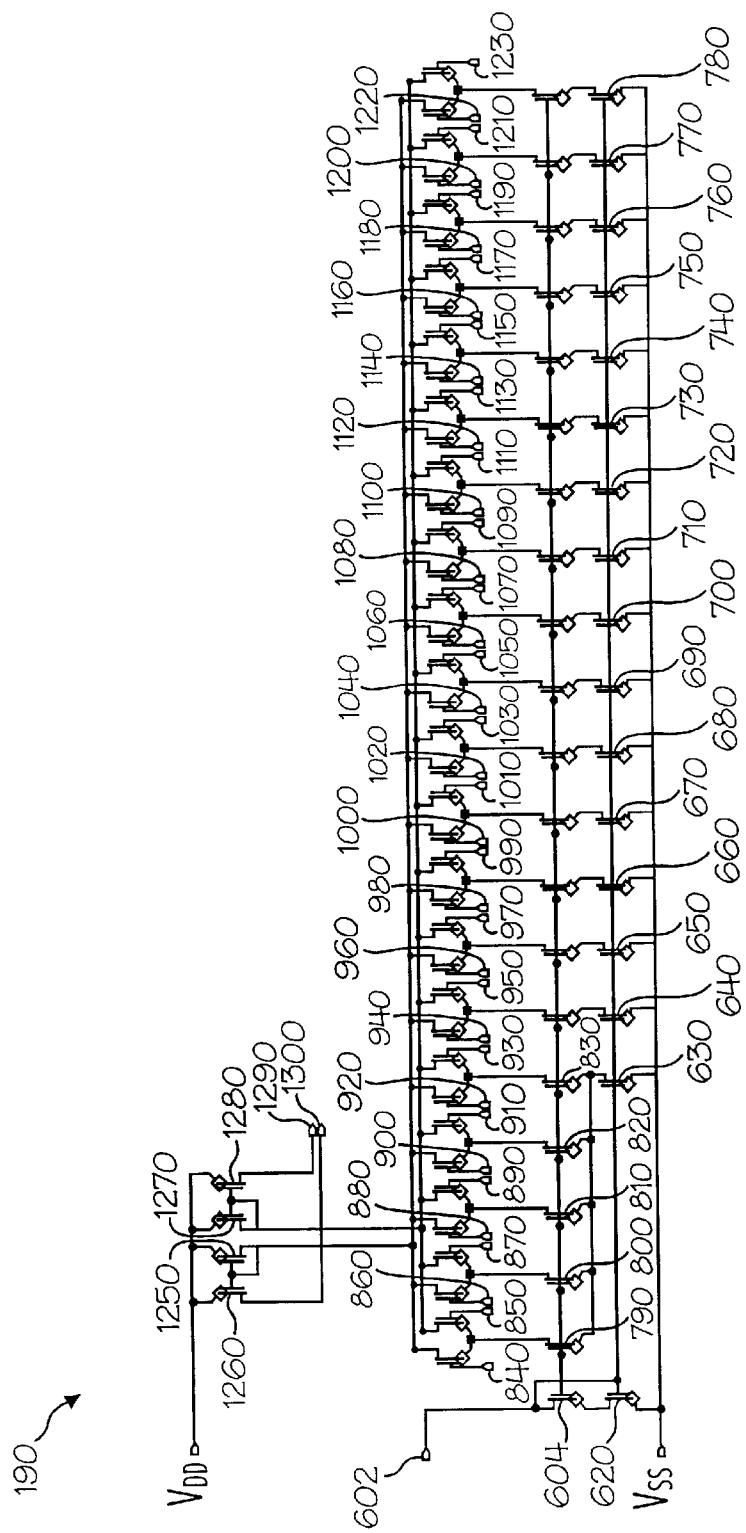
FIG. 6 is a schematic illustration of a differential current output digital-to-analog converter in accordance with one embodiment of the present invention.

FIG. 6 schematically illustrates an exemplary differential current output digital-to-analog converter, suitable for use as the coarse tune DAC 190, illustrated in FIGS. 1 and 3. DAC 190 includes a reference current input 602, output current ports 1290 and 1300, a low voltage cascode mirror including transistors 604 and 620, a plurality of current sinks 630–780, which are preferably identical, scaled transistors 790–830, mirror transistors 1250 and 1270, and digital input ports 840–1230.

In operation, a reference current is provided at input 602, which establishes a range of the differential output current at output ports 1290 and 1300. The reference current applied at port 602 is mirrored using a low voltage cascode mirror including transistors 604 and 620. Transistors 604 and 620 are coupled to (preferably) identical current sinks 630–780. The current from sink 630 is further divided into binary scaled currents using scaled transistors 790–830, such that the total current through transistors 790–830 equals the current in transistor 630. The current through transistors 790 and 800 is $\frac{1}{16}$ of the current that flows through transistor 630; the current through transistor 810 is $\frac{1}{8}$ of the current through transistor 630; the current through transistor 820 is $\frac{1}{4}$ the current through transistor 630; and the current in transistor 830 is $\frac{1}{2}$ the current through transistor 630.

Current from transistor 790 is steered into either current mirror 1250 or 1270, depending on the digital output at ports 840 and 850. Similarly, the current in transistor 800 is steered into transistor 1250 or 1270, depending on the differential digital input at digital input ports 850 and 860, and import ports 870–1230 steer current from current sinks 630–780.

In the illustrated embodiment, DAC 190 is an eight bit DAC where inputs 940–1230 are used to steer 15 equal segments consisting of the 4 most significant bits of the DAC, and inputs 860–930 are used to steer 4 binary weighted segments consisting of the 4 least significant bits of the DAC. Inputs 840 and 850 are redundant and may be either held static or used as a redundant least significant bit for the DAC. An eight bit binary word is converted into the control word by decoding the 4 most significant bits using a thermometer code to generate differential inputs 940–1230, and by applying the 4 least significant bits to differential inputs 860–930.

The current steering scheme described above results in a fixed total current in transistors 1250 and 1270 equal to the sum of currents in current sinks 630–680, which is independent of the control word applied at inputs 840–1230. The difference in current between transistors 1250–1270 is dependent on the control word applied to inputs 840–1230. The differential currents steered into transistors 1250 and 1270 are mirrored by transistors 1260 and 1280, resulting in a differential current at output ports 1290 and 1300.

In the case of the exemplary embodiment, the control voltage range is about −1.2 V to +1.2 V. Each coarse tune word change corresponds to approximately 1.2 V of change in the control voltage. By using an eight bit DAC, 32 voltage steps can be selected by changing the codeword (256 total DAC codewords divided by 8) as noted below in table 1.

TABLE 1

| Coarse Tune Word | DAC Codeword | Control Voltage Range | VCO Frequency Range |
| --- | --- | --- | --- |
| 0 | 00010000 | −1.2 to 1.2 | 1.5 to 1.9 GHz |
| 1 | 00110000 | −1.2 to 1.2 | 1.7 to 2.1 GHz |

TABLE 1-continued

| Coarse Tune Word | DAC Codeword | Control Voltage Range | VCO Frequency Range |
|---|---|---|---|
| 2 | 01010000 | −1.2 to 1.2 | 1.9 to 2.3 GHz |
| 3 | 01110000 | −1.2 to 1.2 | 2.1 to 2.5 GHz |
| 4 | 10010000 | −1.2 to 1.2 | 2.3 to 2.7 GHz |
| 5 | 10110000 | −1.2 to 1.2 | 2.5 to 2.9 GHz |
| 6 | 11010000 | −1.2 to 1.2 | 2.7 to 3.1 GHz |
| 7 | 11110000 | −1.2 to 1.2 | 2.9 to 3.3 GHz |

By way of particular example, if device 100 is operating at coarse tune word 2, a control voltage of 1.2, a frequency of 2.5 GHz, and stress comparators set at −1.0 and 1.0 V, since the control voltage is at 1.2V, the comparators detect a stress and the coarse tune update logic will change to coarse tune word 3 (the DAC code from 01010000 to 01110000) in 32 steps:
01010001
01010010
01010011
01010100
01101111
01110000
The coarse tune voltage will slowly change as the DAC codeword is changed and eventually go from +1.2 V to 0V differential. At this point, the loop has been destressed.

In a alternate embodiment, not only are 32 steps taken, but the steps are taken in pulse width modulated manner. For example to change from 010100001 to 01010010, the following would occur:
01010010 for 1 cycle
01010001 for 31 cycles
01010010 for 1 cycle
01010001 for 15 cycle
01010010 for 1 cycle
01010001 for 15 cycles
01010010 for 1 cycle
01010001 for 15 cycle
01010010 for 1 cycle
01010001 for 7 cycles
01010010 for 1 cycle
01010001 for 7 cycles
01010010 for 1 cycle
01010001 for 7 cycle
01010010 for 1 cycle
01010001 for 7 cycles
Slowly more 01010001 than 01010001 are built up. The net effect is the generation of a slow ramp, which is desirable because the loop tracks the slow change so that the VCO output frequency remains constant as the codeword update is completed.

Figure 7:
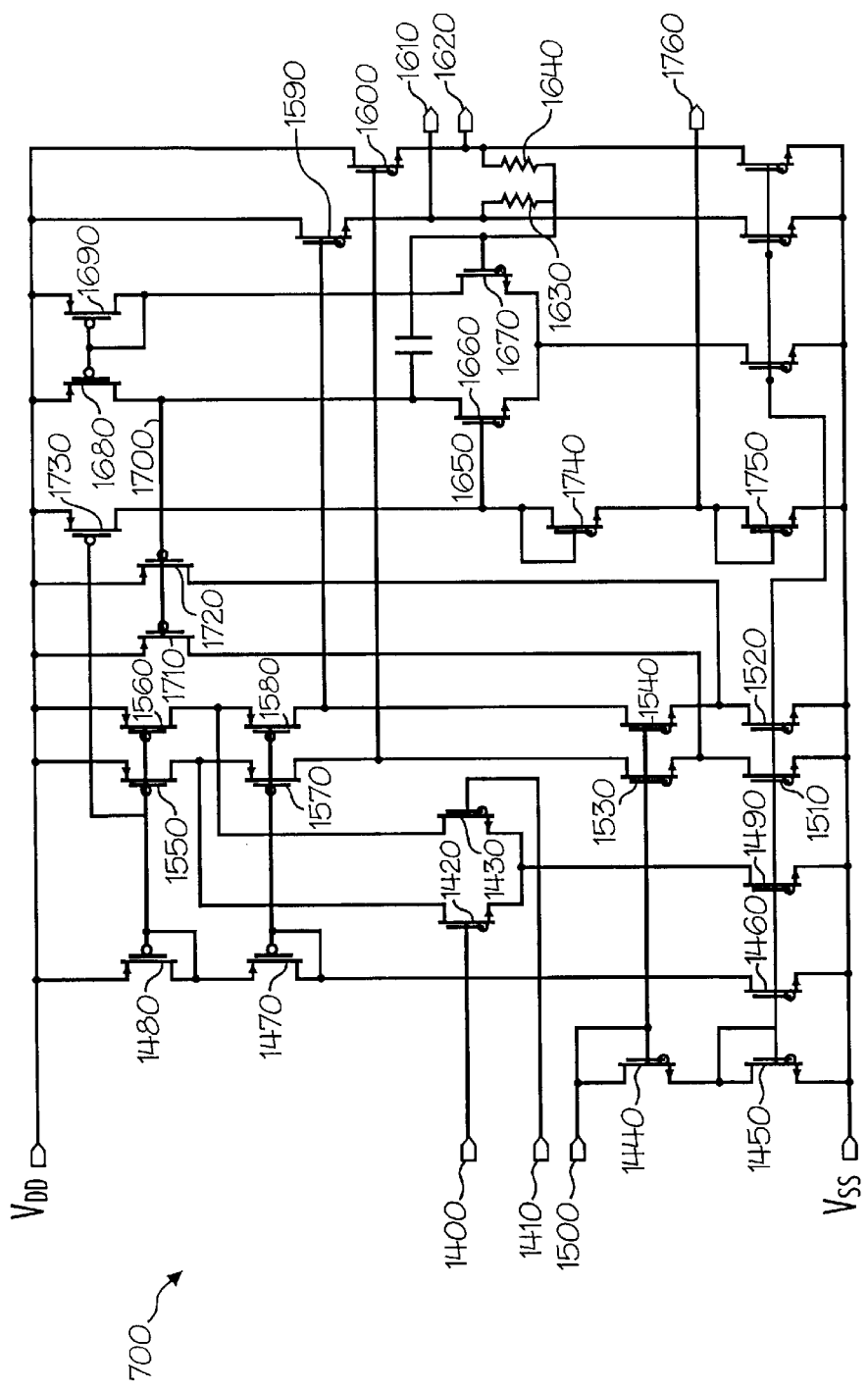
FIG. 7 is a schematic illustration of a differential operational amplifier in accordance with the present invention.

FIG. 7 schematically illustrates a differential output operational amplifier 700, including input ports 1400 and 1410, in accordance with one embodiment of the invention, which is suitable for use as part of integrator 130, illustrated in FIGS. 1 and 3. Feedback capacitors (e.g., capacitors 250, 260) and resistors (e.g., resistors 270, 280) are connected as part of a feedback loop of opamp 700 to form integrator 130, as illustrated in FIG. 2.

Opamp 700 is a folded cascode topology opamp with input differential pair transistors 1420 and 1430 biased by a current sink transistor 1490. A reference current is provided at a port 1500. The reference current drives a cascode mirror formed by transistors 1440 and 1450. The folded cascode current sink is formed by transistors 1510 and 1520 and cascode transistors 1530 and 1540. The reference current is mirrored by transistors 1460, 1470 and 1480. The folded cascode current source is formed by transistors 1550 and 1560 and cascode transistors 1570 and 1580. The differential output is then buffered by source followers 1590 and 1600 and provided at ports 1610 and 1620.

The output common mode voltage is set by a common mode loop. Sense resistors 1630 and 1640 are used to sense the common mode voltage and compare the voltage to a reference voltage at node 1650. A common mode amplifier is formed by differential pair transistors 1660 and 1670 and current mirror transistors 1680 and 1690, generating a control voltage at node 1700. The control voltage at node 1700 drives two current sources 1710 and 1720, which cause a common mode shift in folded cascode opamp 700. The reference voltage at node 1650 is generated by current source 1730 and diode connected transistors 1740 and 1750. This circuit also generates an additional reference voltage at port 1760 which is used to set a lower limit on the voltage at ports 1610 and 1620 by the stress detection circuit.

Figure 8:
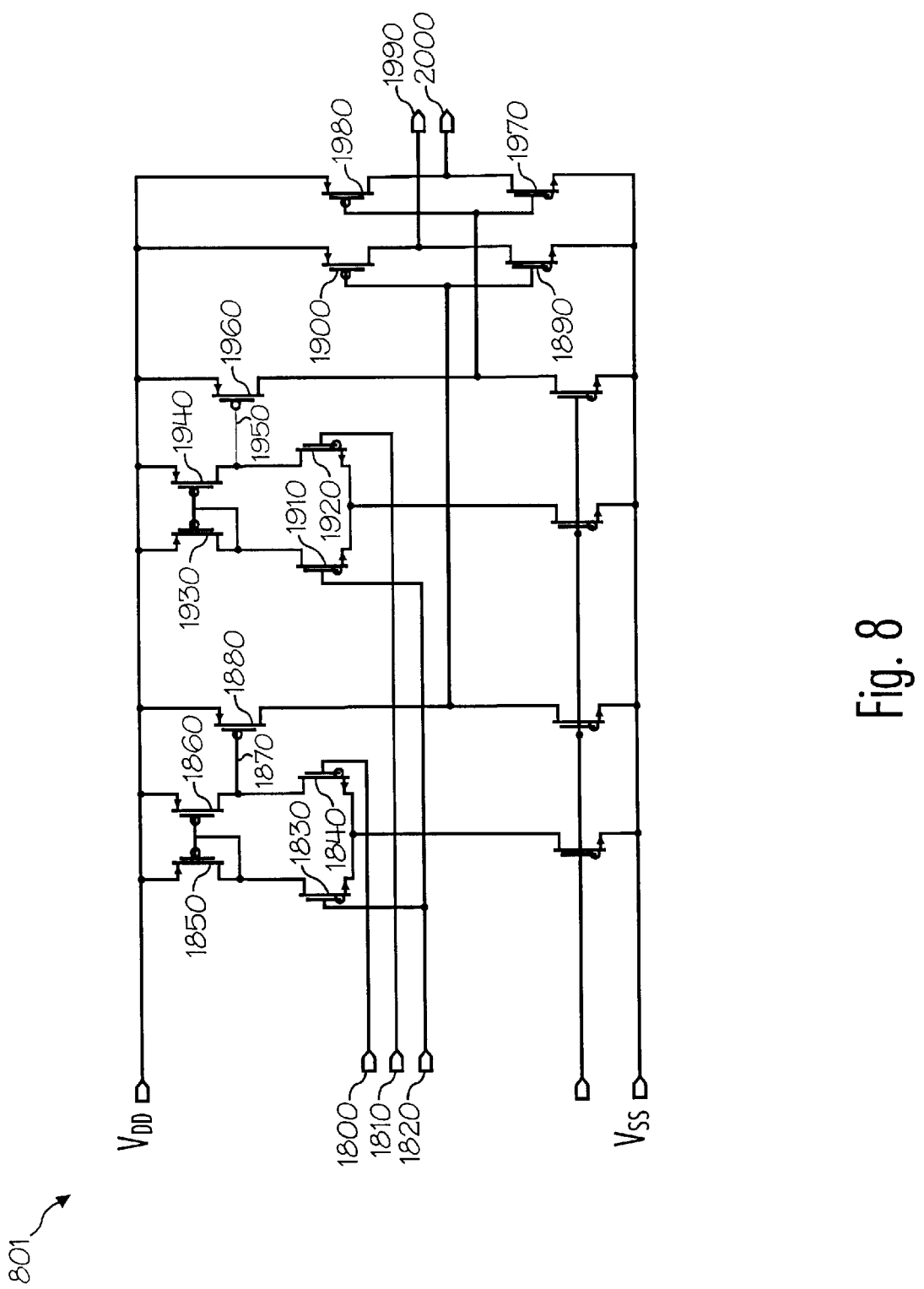
FIG. 8 is a schematic illustration of a comparator in accordance with the present invention.

FIG. 8 illustrates a comparator circuit 801 (e.g., a combination of comparators 210 and 220 illustrate in FIG. 2) in accordance with an exemplary embodiment of the present invention. Comparator circuit 801 is configured to receive differential outputs signals, from ports 1610 and 1620 of opamp 700, at input ports 1800 and 1810.

A comparison voltage generated in opamp 700 output port 1760 is connected to input port 1820. Differential pair transistors 1830 and 1840 compare voltages at input ports 1800 and 1820, generating an output voltage 1870 through current mirror transistors 1850 and 1860. This output is amplified through common source amplifier 1880 and a full digital signal is generated through the inverter formed by transistors 1890 and 1900. The digital output at port 1990 corresponds to the output of comparator 210 and indicates that the differential voltage across 1800 and 1810 is too negative, and that coarse tune DAC 190 value should be decreased so that the differential voltage across 1800 and 1810 may be correspondingly increased and the loop destressed. Similarly, differential pair transistors 1910 and 1920 compare voltages at input ports 1810 and 1820, generating an output voltage 1950 through current mirror transistors 1930 and 1940. This output is amplified through a common source amplifier 1960 and a full digital signal is generated through the inverter formed by transistors 1970 and 1980. The digital output at port 2000 corresponds to the output of comparator 220 and indicates that the differential voltage across 1800 and 1810 is too positive, and that the coarse tune DAC value should be increased so that the differential voltage across 1800 and 1810 may be correspondingly decreased and the loop destressed.

Although the present invention is set forth herein in the context of the appended drawing figures, it should be appreciated that the invention is not limited to the specific form shown. For example, while detailed descriptions of exemplary DAC, integrator, comparator, summer and driver, and VCO circuits are provided above, such circuits or portions of thereof may be replaced by circuits that perform similar functions in similar ways. Various other modifications, variations, and enhancements in the design and arrangement of the phase lock loop destress circuit as set forth herein may be made without departing from the spirit and scope of the present invention as set forth in the appended claims.

I claim:
1. A phase lock loop circuit comprising:
   a voltage controlled oscillator;
   a summer and driver circuit coupled to the voltage controlled oscillator;

an integrator coupled to the summer and driver circuit;
a coarse tune digital-to-analog converter coupled to the summer and driver circuit; and
a loop destress logic circuit, including a comparator circuit configured to automatically update a digital word, coupled to the coarse tune digital-to-analog converter and the integrator,
wherein the phase lock loop circuit is configured to select a digital word for use by the digital-to-analog converter to coarse tune the voltage controlled oscillator.

2. The phase lock loop circuit of claim 1, wherein the loop destress logic circuit is configured to automatically update a word when an operating frequency of the voltage controlled oscillator is outside a pre-selected operating range.

3. The phase lock loop circuit of claim 2, wherein the pre-selected operating range is about 2.3 GHz to about 2.7 GHz.

4. The phase lock loop circuit of claim 1, further comprising a frequency divider coupled to the voltage controlled oscillator.

5. The phase lock loop circuit of claim 1, wherein the voltage controlled oscillator comprises a look-ahead interpolation architecture.

6. The phase lock loop circuit of claim 1, wherein the voltage controlled oscillator comprises a differential voltage-to-current translator configured to produce a control voltage.

7. The phase lock loop circuit of claim 1, wherein the coarse tune digital-to-analog converter is a differential current output digital-to-analog converter.

8. The phase lock loop circuit of claim 1, wherein the coarse tune digital-to-analog converter is an eight bit converter.

9. The phase lock loop circuit of claim 1, wherein the integrator comprises an operational amplifier.

10. The phase lock loop circuit of claim 9, wherein the operational amplifier is a folded cascode topology amplifier.

11. A phase lock loop circuit comprising:
a voltage controlled oscillator having
   a first pair of differential transistors coupled to a first input port;
   a second pair of differential transistors coupled to a second input port;
   a third pair of differential transistors coupled to a first control voltage port; and
   a fourth pair of differential transistors coupled to a second control voltage port;
a summer and driver circuit coupled to the voltage controlled oscillator;
an integrator coupled to the summer and driver circuit;
a coarse tune digital-to-analog converter coupled to the summer and driver circuit; and
a loop destress logic circuit coupled to the coarse tune digital-to-analog converter and the integrator,
wherein the phase lock loop circuit is configured to select a digital word for use by the digital-to-analog converter to coarse tune the voltage controlled oscillator.

12. A phase lock loop destress circuit comprising:
a phase frequency detector;
a charge pump coupled to the phase frequency detector;
an integrator coupled to the charge pump;
a loop destress logic circuit, having a comparator circuit configured to automatically update a digital word by detecting when a control voltage is near the control voltage minimum or maximum operating range, and coupled to the integrator;
a coarse tune digital-to-analog converter coupled to the integrator;
a summer and driver circuit coupled to the integrator; and
a voltage controlled oscillator coupled to the summer and driver, wherein the loop destress logic circuit is configured to automatically update a digital word used to coarsely adjust an operating frequency of the voltage control led oscillator.

13. The phase lock loop destress circuit of claim 12, further comprising a frequency divider coupled to the voltage controlled oscillator.

14. The phase lock loop destress circuit of claim 12, wherein the voltage controlled oscillator comprises a look-ahead interpolation architecture.

15. The phase lock loop destress circuit of claim 12, wherein the voltage controlled oscillator comprises a differential voltage-to-current translator configured to produce a control voltage.

16. The phase lock loop destress circuit of claim 12, wherein the coarse tune digital-to-analog converter is a differential current output digital-to-analog converter.

17. The phase lock loop destress circuit of claim 12, wherein the integrator comprises an operational amplifier.

18. A phase lock loop destress circuit comprising:
a phase frequency detector;
a charge pump coupled to the phase frequency detector;
an integrator comprising an operation amplified with cascode topology coupled to the charge pump;
a loop destress logic circuit coupled to the integrator;
a coarse tune digital-to-analog converter coupled to the integrator;
a summer and driver circuit coupled to the integrator; and
a voltage controlled oscillator comprising look-ahead interpolation topology coupled to the summer and driver,
   wherein the loop destress logic circuit is configured to automatically update a digital word used to coarsely adjust an operating frequency of the voltage controlled oscillator.

19. The phase lock loop destress circuit of claim 18, wherein the loop destress logic circuit is configured to automatically update a digital word used to coarsely adjust the voltage controlled oscillator, using fine steps to minimize the transient changes in the oscillator frequency while the coarse tune word is being updated.

20. The phase lock loop destress circuit of claim 18, wherein the loop destress logic circuit is configured to automatically update a digital word used to coarsely adjust the voltage controlled oscillator, using pulse width modulation of the coarse tune word to minimize transient changes in frequency of the voltage controlled oscillator while the coarse tune word is being updated.

21. The phase lock loop destress circuit of claim 18, wherein the loop destress logic circuit is configured to automatically update a digital word used to coarsely adjust the voltage controlled oscillator, using fine steps and pulse width modulation of the coarse tune word to minimize transient changes in frequency of the voltage controlled oscillator while the coarse tune word is being updated.

22. A phase lock loop destress circuit comprising:
a phase frequency detector;
a charge pump coupled to the phase frequency detector;
an integrator coupled to the charge pump;
a loop destress logic circuit coupled to the integrator, said loop destress logic circuit being configured to automatically update a digital word used to coarsely adjust the voltage controlled oscillator, using fine steps to minimize the transient changes in the oscillator frequency while the coarse tune word is being updated;

a coarse tune digital-to-analog converter coupled to the integrator;

a summer and driver circuit coupled to the integrator; and a voltage controlled oscillator coupled to the summer and driver;

wherein the loop destress logic circuit updates a digital word used to coarsely adjust an operating frequency of the voltage controlled oscillator.

23. A phase lock loop destress circuit comprising:

a phase frequency detector;

a charge pump coupled to the phase frequency detector;

an integrator coupled to the charge pump;

a loop destress logic circuit coupled to the integrator, said loop destress logic circuit being configured to automatically update a digital word used to coarsely adjust the voltage controlled oscillator, using pulse width modulation of the coarse tune word to minimize transient changes in frequency of the voltage controlled oscillator while the coarse tune word is being updated;

a coarse tune digital-to-analog converter coupled to the integrator;

a summer and driver circuit coupled to the integrator; and a voltage controlled oscillator coupled to the summer and driver;

wherein the loop destress logic circuit updates the digital word used to coarsely adjust an operating frequency of the voltage controlled oscillator.

24. A phase lock loop destress circuit comprising:

a phase frequency detector;

a charge pump coupled to the phase frequency detector;

an integrator coupled to the charge pump;

a loop destress logic circuit coupled to the integrator, said loop destress logic circuit being configured to automatically update a digital word used to coarsely adjust the voltage controlled oscillator, using fine steps and pulse width modulation of the coarse tune word to minimize transient changes in frequency of the voltage controlled oscillator while the coarse tune word is being updated;

a coarse tune digital-to-analog converter coupled to the integrator;

a summer and driver circuit coupled to the integrator; and a voltage controlled oscillator coupled to the summer and driver;

wherein the loop destress logic circuit updates the digital word used to coarsely adjust an operating frequency of the voltage controlled oscillator.

* * * * *